United States Patent [19]

Salmon et al.

[11] Patent Number: 4,488,238

[45] Date of Patent: Dec. 11, 1984

[54] SELECTION STAGE OF THE AC SIGNAL OF GREATER AMPLITUDE BETWEEN TWO SIGNALS OF DIFFERENT FREQUENCIES

[75] Inventors: Jean P. Salmon, Aulnay Sous Bois; Daniel M. Laurent, Paris, both of France

[73] Assignee: Jeumont-Schneider Corporation, France

[21] Appl. No.: 324,398

[22] PCT Filed: Mar. 17, 1981

[86] PCT No.: PCT/FR81/00039

§ 371 Date: Nov. 16, 1981

§ 102(e) Date: Nov. 16, 1981

[87] PCT Pub. No.: WO81/02714

PCT Pub. Date: Oct. 1, 1981

[30] Foreign Application Priority Data

Mar. 18, 1980 [FR] France ................................ 80 05981

[51] Int. Cl.[3] ........................ G01R 19/00; G06G 7/02; H04B 1/06
[52] U.S. Cl. .................................... 364/483; 364/480; 364/484; 364/514; 364/825; 246/8; 246/167 R; 307/354; 307/520; 328/137; 328/167; 340/47; 340/48
[58] Field of Search ............... 364/424, 436, 480, 481, 364/483, 484, 514, 825; 340/47, 48; 328/137, 138, 146, 147, 149, 165, 167; 307/231, 518, 520, 522, 354; 377/55; 246/7, 8, 167 R

[56] References Cited

U.S. PATENT DOCUMENTS

| 3,314,026 | 4/1967 | Maynard ........................ 307/520 X |
| 3,743,935 | 7/1973 | Alt .................................... 340/47 X |
| 3,760,278 | 9/1973 | Narbaits-Jaureguy et al. .... 246/8 X |
| 3,868,575 | 2/1975 | Narbaits-Jaureguy et al. .... 246/8 X |
| 3,973,746 | 8/1976 | Ball .................................... 246/187 |

FOREIGN PATENT DOCUMENTS

| 2176266 | of 0000 | France . |
| 2313812 | of 0000 | France . |
| 1164386 | of 0000 | United Kingdom . |
| 1151614 | of 0000 | United Kingdom . |

*Primary Examiner*—Errol A. Krass
*Assistant Examiner*—Kevin J. Teska
*Attorney, Agent, or Firm*—Rines and Rines

[57] ABSTRACT

This disclosure is concerned with an alternating signal amplitude selection stage of particular application in devices for information transmission, as in track systems along which there are in succession a number of transmission zones each employing oscillating carrier frequencies, and with a view to avoiding crosstalk problems between signals in adjacent zones. According to the invention, the selection stage comprises an operational amplifier placed in an open loop, a counter of the number of impulse peaks included in the output signal of the differential amplifier, and a circuit for controlling the switching of an inverter to connect the appropriate filter to the input of a processing device for the signal of greater amplitude to eliminate the signal of lesser amplitude.

7 Claims, 1 Drawing Figure

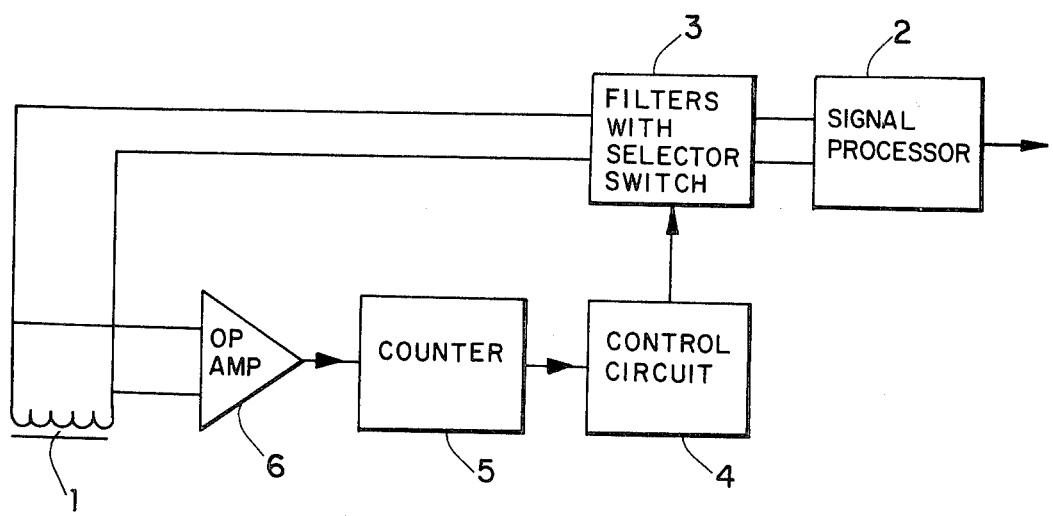

SELECTION STAGE OF THE AC SIGNAL OF GREATER AMPLITUDE BETWEEN TWO SIGNALS OF DIFFERENT FREQUENCIES

The present invention relates to amplitude selection circuits and, more particularly, to selection stages for selecting the alternating signal of greater amplitude between two signals of different predetermined frequencies, the mean amplitudes of which may vary.

Such a selection stage finds application notably in devices for information transmission, by rail, between a railway track and a set of vehicles circulating in the same direction on that track, and along which tracks there are in succession a number of information transmission zones wherein the useful information signal carrier frequencies alternate from one zone to the following zone. In such a device, any crosstalk must have no influence on the correct reception of signals on board a railway vehicle circulating within a given zone.

The mean amplitude of the signals emitted in each zone may vary in a significant way between the upstream and downstream end of the zone, so that simple limit detectors cannot be used to eliminate the signals emitted in adjacent zones. The ratio of the amplitude of the useful signal to that of the interference signal, however, always remains greater than one, whatever the respective amplitudes may be.

An object of the invention, accordingly, is to provide a new and improved signal amplitude selection system that improves upon the possible influence of such crosstalk and enables novel elimination of undesired signals in adjacent transmission zones as in railway systems and the like.

A further object is to provide a novel selection stage of more general applicability, as well; and other objects will be hereinafter pointed out and delineated in the appended claims.

In summary, according to one aspect of the invention, the selection stage for the alternating signal of greater amplitude between two signals of different predetermined frequencies whose respective amplitudes differ, comprises an operational amplifier; filter means having an input and an output and being switchable to eliminate, selectively, signals of one or the other of the predetermined frequencies; means for applying the sum of the two signals to the respective inputs of the operational amplifier and the filter means; counter means for counting the pulses in the output signal from the operational amplifier resulting from zero crossings in the input signal thereto, the output signal from the counter means having a period corresponding to that of the signal of greater amplitude; and a control circuit connected to the output of the counter means and to the filter means, the control circuit being responsive to the output signal from the counter means for causing the filter means to switch to eliminate the signal of lower amplitude, whereby the signal of greater amplitude is applied to a processing device connected to the output of the filter means. The control circuit may include a selector of the period of the output signal of the counter such as is described, for example, in French Pat. Nos. 2,176,266 and 2,313,812.

The invention will be better understood, and other goals advantages and characteristics will become more clear through the reading of the following description, to which is appended the accompanying drawing, the single FIGURE of which represents schematically a device for the processing of the signal of greater amplitude provided by a selection stage conforming to the present invention in best or preferred mode.

Referring to the drawing, a device is shown for information processing, such as aboard railway vehicles circulating on tracks equipped with an information transmission device utilizing two predetermined carrier frequencies alternating from one zone to the following. A coil 1 constitutes the element for reception by induction of the useful information-bearing signal, emitted, for example, by mean of an insulated conductive loop winding placed between the rails of the track within a transmission zone, not represented in the FIGURE.

Since such a zone may extend to several kilometers in length, it is evident that the useful signal received by a train circulating in that zone may be of a very variable amplitude as a function of the distance from the loop. Furthermore, the signal emitted in the adjacent zone with a different carrier frequency may partially penetrate into the zone in which the train is circulating and be received by the coil 1. Coil 1 thus sums the useful signal and the interfering signal from the adjacent zone, creating an unfavorable crosstalk, despite the presence of resonant circuits tuned respectively to each of the carrier frequencies (such as pairs of series resonant circuits) and connected between the two rails of the track at the ends of each zone. As noted previously, however, the interfering signal will always be of lower amplitude than the useful signal.

So that the usual processing device 2 will process only the useful signal, that is, the signal of greater amplitude, it is necessary to eliminate the interfering signal at the input to the device. In accordance with the invention, the interfering signal is eliminated in a filtering stage (with selector switch) 3, the input and output of which are respectively connected to the coil 1 and processing device 2, as shown. The filtering stage 3 is controllable (as will be described more fully hereinafter) to pass, selectively, one or the other of the two signal frequencies. The filtering stage may, for example, be constituted by two branches in parallel, comprising respectively a series resonant circuit tuned to the frequency of one and the other of the two signals, selectively connected to the line through the intermediary of an inverter (i.e., a two position switch), as is well known, so that only one or the other of the two branches will be in use.

The switching of the inverter is then controlled by the output of a control circuit 4, to the input of which is connected the output of a counter 5. The sum of the two signals (the useful signal and the interfering signal), collected by the coil 1, is applied to the input terminals of an operational amplifier 6 placed in open loop.

In this way, the operational amplifier 6 delivers at its output, which is connected to the input of the counter 5, a signal resulting from its switching at the instant of each passage through zero of the signal sum applied at the input. The counter 5 counts these passages through zero (and thus the pulses in the amplifier output signal resulting from the zero crossings of the input signal), and in response delivers a rectangular-wave signal whose period depends on the signal of greater amplitude. In point of fact, it can be shown that with $f_1$ and $f_2$ being the respective frequencies of the emitted signals, if the amplitude of the signal of frequency $f_1$ is greater than that of the other signal, the number of passages through zero of the signal sum $f_1 + f_2$ applied to the input of the operational amplifier is equal to $$n_1 = 2f_1/(f_1 - f_2);$$

and conversely, if the amplitude of the signal of frequency $f_2$ is greater than that of the other signal, the number of passages through zero is equal to $$n_2 = 2f_2/(f_1 - f_2),$$

during a period of time of duration $$1/(f_1 - f_2).$$

Thus it follows that $$n_1/n_2 = f_1/f_2.$$

It follows from this, that the period of the rectangular wave signal delivered by the counter 5 is directly proportional to the period of the signal of greater amplitude, assuming the counter possesses a determined counting capacity.

Thus the control circuit 4 for the switching of the inverter may favorably include a period selector such as is described in the patents cited previously, the response of which does or does not perform switching, so as to place in service in the filtering stage 3 the filter appropriate for elimination of the signal of lesser amplitude. Therefore, only the signal of greater amplitude appears at the output of filtering stage 3.

In this way the processing device 2 is insensitive to this lesser signal, and processes the signal of greater amplitude without risk of error, which is always the useful signal.

Although only one mode of realization of the invention has been described, it is obvious that any modification brought about within the same spirit will not constitute a departure from the scope of the present invention. In particular, this selection stage may be adapted to be used in other types of systems in which crosstalk resulting from an interfering signal of a determined frequency must be eliminated.

What is claimed is:

1. Apparatus for selecting the signal of greater amplitude from two alternating signals of different predetermined frequencies and different amplitudes, comprising an operational amplifier, filter means having an input and an output and being switchable to eliminate, selectively, signals of one or the other of said predetermined frequencies, means for applying the sum of said two signals to the respective inputs of said operational amplifier and said filter means, counter means connected to the output of said operational amplifier for counting the pulses in the output signal from said amplifier resulting from zero crossings of the input signal to said amplifier, the output signal from said counter means having a period corresponding to that of said signal of greater amplitude, and a control circuit connected to the output of said counter means and to said filter means, said control circuit being responsive to the output signal from said counter means for causing said filter means to switch to eliminate the one of said two signals with the lower amplitude, whereby said signal of greater amplitude is supplied to a processing device connected to the output of said filter means.

2. Apparatus according to claim 1, wherein the said control circuit includes a period selector.

3. Apparatus according to claim 1, wherein said applying means comprises a signal-summing coil connected to inputs of said operational amplifier and said filter means, respectively.

4. Apparatus for selecting the signal of greater amplitude from two alternating signals of different predetermined frequencies and different amplitudes, comprising an operational amplifier, filter means having an input and an output and being controllable to pass, selectively, one or the other of said predetermined frequencies, means for applying to the respective inputs of said amplifier and said filter means the sum of said two signals, means connected to the output of said amplifier for producing a signal having a period proportional to that of said signal of greater amplitude, and control means responsive to the produced signal for controlling said filter means to pass the frequency of said signal of greater amplitude.

5. Apparatus according to claim 4, wherein said signal producing means comprises a counter for counting the pulses in the output signal from said amplifier resulting from zero crossings in the input signal thereto.

6. Apparatus according to claim 4, wherein said control means comprises a period selector.

7. Apparatus according to claim 4, wherein said applying means comprises a signal-summing coil.

* * * * *